(12) United States Patent
Zhang

(10) Patent No.: US 10,510,298 B2
(45) Date of Patent: Dec. 17, 2019

(54) PIXEL DRIVING CIRCUIT, DISPLAY APPARATUS AND TERMINAL

(71) Applicant: Wuhan China Star Optoelectronics Semiconductor Display Technology Co., Ltd., Wuhan, Hubei (CN)

(72) Inventor: Di Zhang, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 52 days.

(21) Appl. No.: 15/938,951

(22) Filed: Mar. 28, 2018

(65) Prior Publication Data

US 2019/0156751 A1  May 23, 2019

Related U.S. Application Data

(63) Continuation of application No. PCT/CN2018/071590, filed on Jan. 5, 2018.

(30) Foreign Application Priority Data

Nov. 23, 2017  (CN) .......................... 2017 1 1219837

(51) Int. Cl.
*G09G 3/3258* (2016.01)
*G09G 3/3233* (2016.01)
(Continued)

(52) U.S. Cl.
CPC ......... *G09G 3/3258* (2013.01); *G09G 3/2092* (2013.01); *G09G 3/3233* (2013.01);
(Continued)

(58) Field of Classification Search
CPC .. G09G 3/3258; G09G 3/3233; G09G 3/2092; G09G 2300/0842;
(Continued)

(56) References Cited

U.S. PATENT DOCUMENTS 8,237,637 B2 * 8/2012 Chung ................. G09G 3/3233
345/76
2006/0028409 A1  2/2006 Numao
(Continued)

FOREIGN PATENT DOCUMENTS

CN  101256732 A  9/2008
CN  102314829 A  1/2012
(Continued)

*Primary Examiner* — Brent D Castiaux
(74) *Attorney, Agent, or Firm* — Hemisphere Law, PLLC; Zhigang Ma

(57) ABSTRACT

The present invention provides a pixel driving circuit, a display apparatus and a terminal. The pixel driving circuit includes: a light-emitting device, an enabling unit, a first transistor and a second transistor. When the light-emitting device illuminates, saturated current passing through the light-emitting device is relevant to the power voltage and the grayscale data voltage. Through embodiment of the present invention, saturated current passing through the driving transistor is relevant to the power voltage and the grayscale data voltage. Furthermore, both the power voltage and the grayscale data voltage are fixed values, that is, current passing through the light-emitting device is guaranteed to the constant. Therefore, current passing through the light-emitting device is no longer affected by the threshold voltage of the driving transistor and non-uniform pixel color could be avoided, accordingly, image uniformity of display with light-emitting device (e.g., OLED) raises, and so does display quality.

15 Claims, 6 Drawing Sheets

(51) Int. Cl.
　　　*H01L 27/32*　　　(2006.01)
　　　*G09G 3/20*　　　(2006.01)
　　　*G09G 3/02*　　　(2006.01)

(52) U.S. Cl.
　　　CPC . *H01L 27/3244* (2013.01); *G09G 2300/0819* (2013.01); *G09G 2300/0842* (2013.01); *G09G 2300/0861* (2013.01); *G09G 2310/0245* (2013.01); *G09G 2310/0264* (2013.01); *G09G 2310/08* (2013.01)

(58) Field of Classification Search
　　　CPC ... G09G 2300/0861; G09G 2300/0819; G09G 2310/0245; G09G 2310/08; G09G 2310/0264; H01L 27/3244
　　　See application file for complete search history.

(56) References Cited

U.S. PATENT DOCUMENTS

| | | | |
|---|---|---|---|
| 2009/0237332 A1 | 9/2009 | Choi | |
| 2010/0013816 A1* | 1/2010 | Kwak | G09G 3/3233 345/211 |
| 2012/0001893 A1* | 1/2012 | Jeong | G09G 3/3233 345/213 |
| 2012/0001896 A1* | 1/2012 | Han | G09G 3/3233 345/214 |
| 2017/0148401 A1* | 5/2017 | Zhao | G09G 3/3648 |

FOREIGN PATENT DOCUMENTS

| | | |
|---|---|---|
| CN | 104021762 A | 9/2014 |
| CN | 104851392 A | 8/2015 |

\* cited by examiner

US 10,510,298 B2

PIXEL DRIVING CIRCUIT, DISPLAY APPARATUS AND TERMINAL

RELATED APPLICATIONS

This application is a continuation application of PCT Patent Application No. PCT/CN2018/071590, filed on Jan. 5, 2018, which claims the priority benefit of Chinese Patent Application No. 201711219837.5, filed on Nov. 23, 2017, which is herein incorporated by reference in its entirety.

FIELD OF THE DISCLOSURE

The present invention relates to a technical field of circuit structure, and more particularly to a pixel driving circuit, a display apparatus and a terminal.

BACKGROUND

At present, the display apparatus with Active-matrix Organic Light Emitting diode (AMOLED) is extensively applied in many types of products. The AMOLED display apparatus consists of plenty AMOLED pixels with rows and columns. AMOLED pixels usually construct the pixel unit circuit with Thin-Film Transistors (TFTs) to provide a corresponding current for the Organic Light-Emitting Diode (OLED) device. Take a basic circuit of AMOLED as an example. The basic circuit of AMOLED, as shown in FIG. 1, concretely is a 2T1C circuit including two transistors and one capacitor, wherein the two transistors are a switching transistor (T1 as shown in FIG. 1) and a driving transistor (T2 as shown in FIG. 1) respectively, and the capacitor is a storage capacitor $C_{st}$. The driving circuit of OLED is controlled by Diver TFT, having a magnitude of $I_{OLED}=k(V_{gs}-V_{th})^2$, where k is a current amplification coefficient determined by Driver TFT characteristic itself and $V_{th}$ is a threshold voltage of Driver TFT. Easily drifting of the threshold voltage $V_{th}$ of Driver TFT cause variation in the OLED driving current with the result that pixels color are not uniform, further having negative effect upon whole display effect of a display.

SUMMARY

Embodiments of the present invention provide a pixel driving circuit, a display apparatus and a terminal. When solving saturated current of the driving transistor, saturated current magnitude is only relevant to the power voltage and the grayscale data voltage. Besides, both the power voltage and the grayscale data voltage are fixed values, that is, current passing through the light-emitting device is guaranteed to the constant, such that current passing through the light-emitting device is no longer affected by the threshold voltage of the driving transistor and non-uniform pixel color could be avoided, accordingly, image uniformity of display with light-emitting device (e.g., OLED) raises, and so does display quality.

In a first aspect, embodiments of the present invention provide a pixel driving circuit, comprising: a light-emitting device, an enabling unit, a first transistor, and a second transistor;

Wherein a first terminal of the light-emitting device connects with a first terminal of the enabling unit and a second terminal of the light-emitting device is grounded. A third terminal of the enabling unit connects with a source of the first transistor. A fourth terminal of the enabling unit receives an operating voltage, and a drain of the first transistor connects with a source of the second transistor. A gate of the first transistor receives a first enabling signal, and a gate of the second transistor receives a first scanning signal. A drain of the second transistor is coupled with a grayscale data voltage signal, wherein the first enabling signal and the first scanning signal are adapted for controlling the source of the first transistor to receive the grayscale data voltage;

Saturated current passing through the light-emitting device is relevant to the voltage of the power and the grayscale data voltage, when the light-emitting device emits light.

In implementation of the embodiment according to the present invention, when above-mentioned pixel driving circuit is at the moment that the light-emitting device is in the light-emitting state, the voltage of the negative electrode of the storage capacitor storing in the charging phase is the difference between the grayscale data voltage and the threshold voltage of the third transistor, and also equal to the gate voltage of the third transistor, i.e., the driving transistor. When solving saturated current of the driving transistor, saturated current magnitude is only relevant to the power voltage and the grayscale data voltage. Besides, both the power voltage and the grayscale data voltage are fixed values, that is, current passing through the light-emitting device is guaranteed to the constant, such that current passing through the light-emitting device is no longer affected by the threshold voltage of the driving transistor and non-uniform pixel color could be avoided, accordingly, image uniformity of display with light-emitting device (e.g., OLEO) raises, and so does display quality;

Optionally, the enabling unit includes a third transistor, a fourth transistor, a fifth transistor, a sixth transistor, a seventh transistor and a storage capacitor;

Wherein a first terminal of the enabling unit is a drain of the fourth transistor; a second terminal of the enabling unit is juncture between a positive terminal of the storage capacitor and a source of the seventh transistor; a third terminal of the enabling unit is juncture between a source of the third transistor and a drain of the seventh transistor; and a fourth terminal of the enabling unit is a drain of the sixth transistor;

A positive terminal of the storage capacitor connects with juncture between the power voltage and the drain of the seventh transistor; a negative terminal of the storage capacitor connects with juncture between a source of the sixth transistor and a gate terminal of the third transistor;

The gate of the third transistor connects with a drain of the fifth transistor, the source of the third transistor T3 connects with juncture between the drain of the seventh transistor T7 and the drain of the first transistor T1, and the drain of the third transistor connects with juncture between the source of the fifth transistor and the source of the fourth transistor;

A gate of the fourth transistor connects with a gate of the seventh transistor, an input signal of the gate in the fourth transistor and an input signal of the gate in the seventh transistor are second enabling signals, and the drain of the fourth transistor connects with a positive electrode of the light-emitting device.

An input signal of a gate in the fifth transistor is the first scanning signal;

An input signal of a gate in the sixth transistor is the second scanning signal, and the drain of the sixth transistor is coupled with the operating voltage;

Optionally, if the first enabling signal is of high level and the first scanning signal is of low level, then the first transistor is in a turn-off state and the second transistor is in a conductive state, and input signals of the drain of the second transistor are grayscale data voltage, in addition, voltage of juncture between the drain of the seventh transistor and the source of the third transistor is not equal to the grayscale data voltage.

Optionally, the sixth transistor is in a conductive state, the storage capacitor discharges through the third transistor and the sixth transistor, and the source and the drain of the third transistor are floated, when the second scanning signal is at a low level;

Optionally, the second enabling signal is at a high level, and the first scanning signal is at a low level and the second scanning signal is at a high level. In the meantime, the fifth transistor is in a conductive state, the sixth transistor is in a turn-off state, the first transistor and the second transistor are in a conductive state, and the storage capacitor is in a charging state. In the meantime, voltage of negative electrode in the storage capacitor is equal to the gate voltage of the third transistor, and specifically is equal to the difference between the grayscale data voltage and threshold voltage of the third transistor.

Optionally, the second enabling signal is at a low level, the second scanning signal and the first scanning signal are at a high level. In the meantime, the fourth transistor and the seventh transistor are in a conductive state, the fifth transistor and the sixth transistor are in a turn-off state and the storage capacitor is in a remaining state. In the meantime, the source voltage of third transistor (i.e., driving transistor) is $V_{dd}$ and the gate voltage is equal to the voltage of negative electrode in storage capacitor, that is, the difference between the grayscale data voltage $V_{data}$ and threshold voltage $V_{th}$ of the third transistor. Thus, the gate-source voltage of the driving transistor could be expressed as "$V_{dd}-V_{data}+V_{th}$" and the gate-source voltage is used to drive light-emitting device to emit light.

Through implementation of embodiments of the present invention, gate-source voltage of the driving transistor in the light-emitting phase could be expressed as "$V_{dd}-V_{data}+V_{th}$", together with the saturated current equation "$I_{OLED}=K(V_{gs}-V_{th})^2$", from which deduce the equation "$I_{OLED}=K(V_{dd}-V_{data})^2$". That is to say, the saturated current of light-emitting device is no longer affected by the threshold voltage of the third transistor (i.e., driving transistor). At the moment, the saturated current magnitude is only relevant to the power voltage $V_{dd}$ and the grayscale data voltage $V_{data}$, and both the power voltage $V_{dd}$ and the grayscale data voltage $V_{data}$ are fixed values, that is, current passing through the light-emitting device is guaranteed to the constant, such that non-uniform pixel color could be avoided, accordingly, image uniformity of display with light-emitting device (e.g., OLED) raises, and so does display quality.

Optionally, the first scanning signal and the first enabling signal could be provided by a GOA circuit. The GOA circuit includes a plurality of cascaded GOA units, and each one stage GOA unit correspondingly drives one stage scanning line, wherein, the GOA circuit drives the scanning signal when N is odd; the GOA circuit drives the scanning signal when N is even.

Optionally, the second scanning signal and the second enabling signal could be provided by a GOA circuit. The GOA circuit includes a plurality of cascaded GOA units, and each one stage GOA unit correspondingly drives one stage scanning line, wherein, the GOA circuit drives the scanning signal when N is odd; the GOA circuit drives the scanning signal when N is even.

Through embodiments of the present invention, the GOA circuit could stage sequentially output signals, so as to implement stage sequentially control of the GOA circuit.

Optionally, the third transistor, the fourth transistor, the fifth transistor, the sixth transistor and the seventh transistor are all p-type transistors, satisfied for being conductive when applied with negative voltage and being turned off when applied with positive voltage.

Optionally, the operating voltage is predetermined constant voltage.

In a second aspect, embodiments of the present invention provide a display apparatus to execute pixel driving circuit from the first aspect.

In a third aspect, embodiments of the present invention provide a terminal including a display apparatus from the second aspect.

BRIEF DESCRIPTION OF THE DRAWINGS

To more clearly illustrate embodiments of the application or technical solutions in the prior art, drawings to be used in the description of the embodiments of the application or the prior art will be briefly introduced hereinafter. In the figures.

In order to understand the above objectives, features and advantages of the present disclosure more clearly, the present disclosure is described in detail below with references to the accompanying drawings and specific embodiments.

DETAILED DESCRIPTION OF PREFERRED EMBODIMENTS

The technology proposals of embodiments of the present invention are described in detail below with references to the accompanying drawings.

Figure 1:
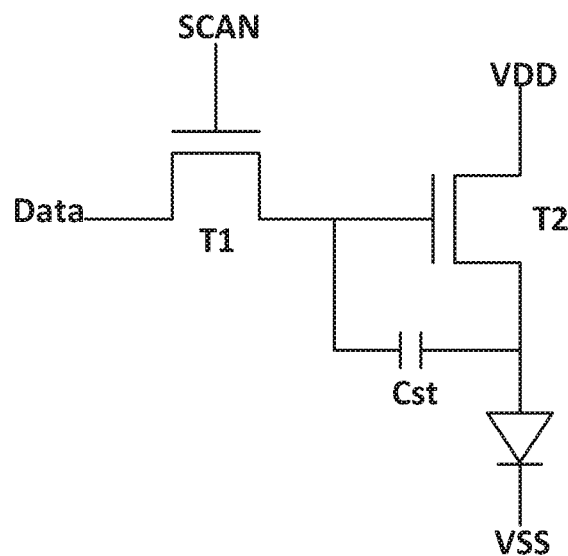
FIG. 1 is a schematic illustrating basic driving circuit of a AMOLED panel according to embodiment of the present invention.
Figure 2:
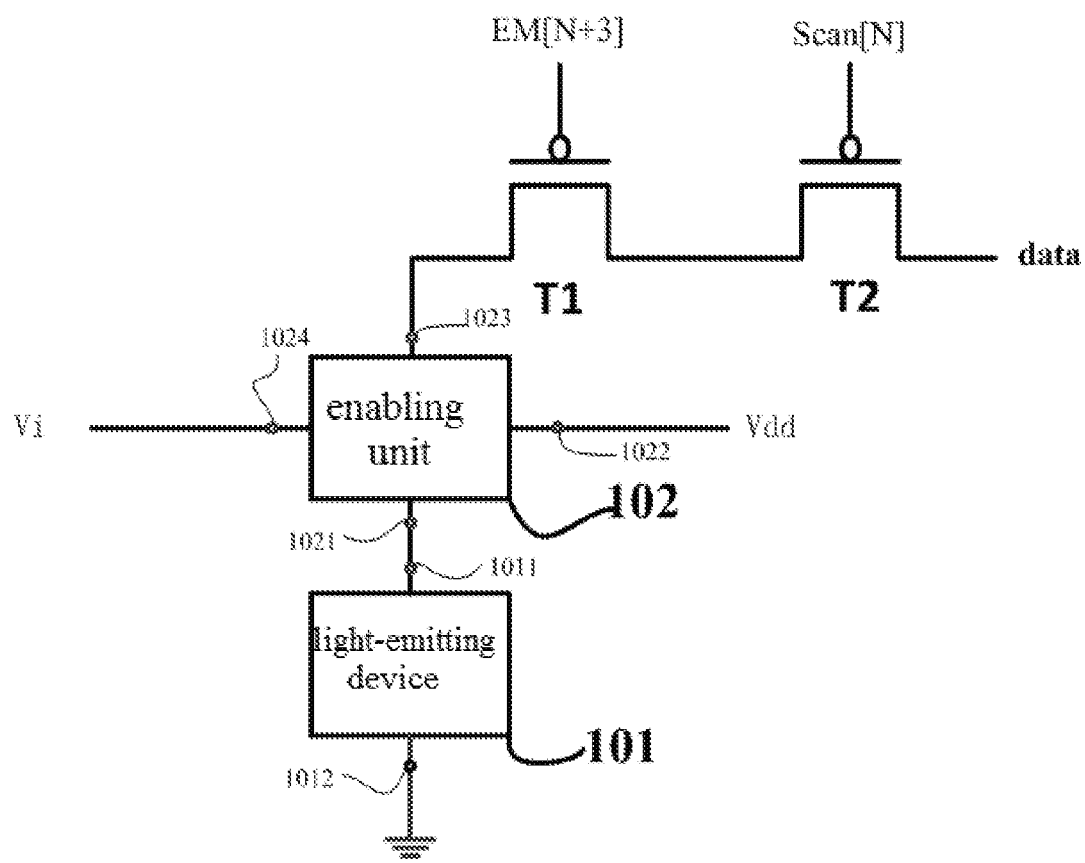
FIG. 2 is a schematic illustrating pixel driving circuit structure according to embodiment of the present invention.

Referring to FIG. 2, which is a schematic illustrating pixel driving circuit structure according to the embodiment of the present invention. As shown in FIG. 2, the pixel driving circuit includes a light-emitting device 101, an enabling unit, a first transistor T1 and a second transistor T2.

Wherein a first terminal of the light-emitting device 101 connects with a first terminal of the enabling unit 102, and a second terminal of the light-emitting device 101 is grounded. A voltage $V_{dd}$ of power accesses a second terminal of the enabling unit 102, and a third terminal of the enabling unit 102 connects with a source of the first transistor T1. A fourth terminal of the enabling unit 102 receives a operating voltage Vi, and a drain of the first transistor T1 connects with a source of the second transistor T2. A gate of the first transistor T1 receives a first enabling signal EM[N+3], and a gate of the second transistor T2 receives a first scanning signal Scan[N]. A drain of the second transistor T2 is coupled with a grayscale data voltage $V_{data}$ signal, wherein the first enabling signal EM[N+3] and the first scanning signal Scan[N] are adapted for controlling the source of the first transistor T1 to receive the grayscale data voltage $V_{data}$.

Saturated current passing through the light-emitting device 101 is relevant to the voltage $V_{dd}$ of the power and the grayscale data voltage $V_{data}$, when the light-emitting device 101 emits light.

Figure 2A:
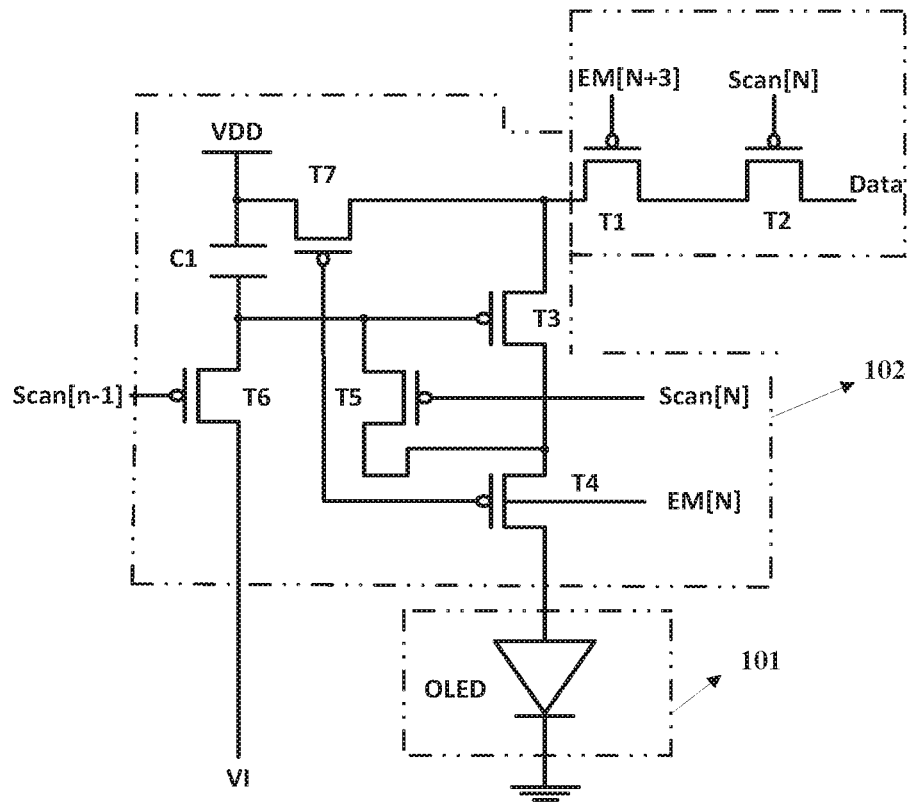
FIG. 2A is a schematic illustrating concrete pixel driving circuit structure according to embodiment of the present invention.

To more clearly illustrate the pixel driving circuit as above, the present invention provides a schematic illustrating the concrete structure of the pixel driving circuit. Through illustrating the operating status, there is deeper analysis on above-mentioned pixel driving circuit, thus the pixel driving circuit is more apparent and explicit. Specifically, referring to FIG. 2A, which is a schematic illustrating the concrete structure of the pixel driving circuit according to the present embodiment, wherein the light-emitting device in FIG. 2A, for example, is OLEDs, but not limited to OLEDs. As shown in FIG. 2A, the concrete structure of the pixel driving circuit is:

The enabling unit 102 includes a third transistor T3, a fourth transistor T4, a fifth transistor T5, a sixth transistor T6, a seventh transistor T7 and a storage capacitor C1;

Wherein a first terminal of the enabling unit 102 is a drain of the fourth transistor T4; a second terminal of the enabling unit 102 is juncture between a positive terminal of the storage capacitor C1 and a source of the seventh transistor T7; a third terminal of the enabling unit 102 is juncture between a source of the third transistor T3 and a drain of the seventh transistor T7; and a fourth terminal of the enabling unit 102 is a drain of the sixth transistor T6;

A positive terminal of the storage capacitor C1 connects with juncture between the voltage $V_{dd}$ of power and the drain of the seventh transistor T7; a negative terminal of the storage capacitor C1 connects with juncture between a source of the sixth transistor T6 and a gate terminal of the third transistor T3;

The gate of the third transistor T3 connects with a drain of the fifth transistor T5, the source of the third transistor T3 connects with juncture between the drain of the seventh transistor T7 and the drain of the first transistor T1, and the drain of the third transistor T3 connects with juncture between the source of the fifth transistor T5 and the source of the fourth transistor T4;

A gate of the fourth transistor T4 connects with a gate of the seventh transistor T7, an input signal of the gate in the fourth transistor T4 and an input signal of the gate in the seventh transistor T7 are second enabling signals EM[N], and the drain of the fourth transistor T4 connects with a positive electrode of the light-emitting device;

An input signal of a gate in the fifth transistor T5 is the first scanning signal Scan[N];

An input signal of a gate in the sixth transistor T6 is the second scanning signal Scan[N−1], and the drain of the sixth transistor T6 is coupled with the operating voltage Vi;

It should be clarified that above-mentioned embodiment of present invention provides a schematic illustrating the concrete structure of the pixel driving circuit, which is merely as an example. The circuit includes, but not limited to, above-mentioned concrete circuit structure and other modifications.

Specifically, the pixel driving circuit includes three operation phase: a reset phase, a data written phase and a light-emitting phase. Subsequently, three phases is illustrated as follows:

Reset phase: the pixel driving circuit operates in the reset phase, when the second enabling signal EM[N] and the first scanning signal Scan[N] are at a high level, i.e., 1, and the second scanning signal Scan[N−1] is at a low level, i.e., 0. In the meantime, the first transistor T1 is in a conductive state, the second transistor T2 is turned off, the sixth transistor T6 is in a conductive state, a positive electrode and a negative electrode of the storage capacitor C1 are reset, and the storage capacitor C1 is in a discharging state. The source and the drain of the third transistor T3 are floated, and a low voltage passes through the gate, therefore at this moment, the third transistor T3 is actually not in a conductive state. It should be clarified that "floated" herein represents not driven. In contexts with respect to transistor circuit, the driving means "Output current charging and discharging an input capacitor to change input voltage". Under floated condition, the amount of charge at an input capacitor, without considering electric leakage, remains the same, that is, the input voltage remains the same.

Figure 3:
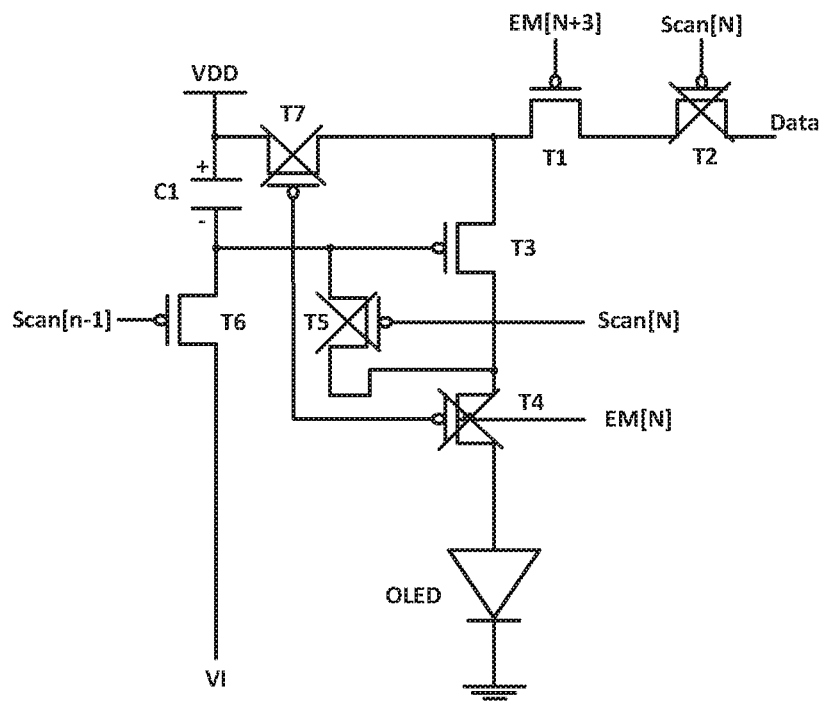
FIG. 3 is a schematic illustrating equivalent circuit structure of the pixel driving circuit in the reset phase according to embodiment of the present invention.

Referring to FIG. 3, which is a schematic illustrating equivalent circuit of pixel driving circuit structure in reset phase according to the embodiment of the present invention. As shown in FIG. 3, the operating voltage Vi is inputted into the pixel driving circuit and the storage capacitor C1 releases itself storage charges through the third transistor T3 and the sixth transistor T6, preventing rest charges in light-emitting process of last phase interfering with the present light-emitting process. After the storage capacitor C1 completely releases the storage charges, the voltage magnitude of positive electrode in the storage capacitor C1 is $V_{dd}$, and the voltage magnitude of negative electrode is Vi.

Figure 4:
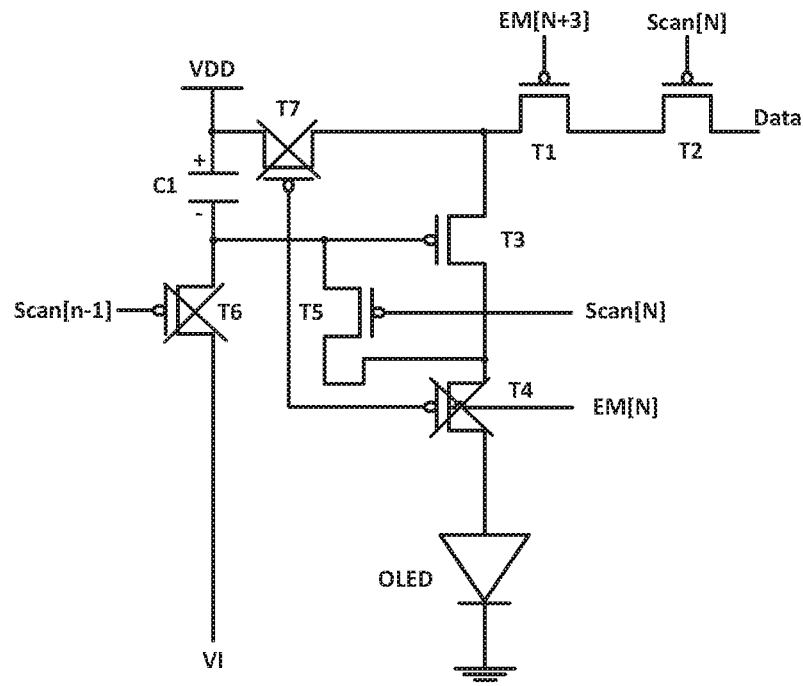
FIG. 4 is a schematic illustrating equivalent circuit structure of the pixel driving circuit in the data written phase according to embodiment of the present invention.

Data written phase: the pixel driving circuit operates in the data written phase, when the second enabling signal EM[N] and the second scanning signal Scan[N−1] are at a high level, i.e., 1, and the first enabling signal EM[N+3] and the first scanning signal Scan[N] are at a low level, i.e., 0. In the meantime, the fourth transistor T4 and the seventh transistor T7 are in a turn-off state, the first transistor T1 and the second transistor T2 are in a conductive state, the third transistor T3 is in a conductive state, the fifth transistor T5 is in a conductive state, the sixth transistor T6 is in a turn-off state, and the storage capacitor C1 is in a charging state. The grayscale data voltage starts to be written, when the first transistor T1 and the second transistor T2 are in a conductive state. Referring to FIG. 4, which is a schematic illustrating equivalent circuit of pixel driving circuit structure in data written phase according to the embodiment of the present invention. As shown in FIG. 4, at this moment, the third transistor T3 is equivalent to a diode, as a result, the gate voltage is equal to source voltage in the third transistor T3.

Voltage of positive electrode in the storage capacitor C1 is $V_{dd}$, and voltage of negative electrode in the storage capacitor C1 is equal to the gate voltage $V_g$ of the third transistor T3. The third transistor T3 is conductive, as a result, gate voltage $V_g$ of the third transistor T3 is equal to the difference between the grayscale data voltage $V_{data}$ and threshold voltage $V_{th}$ of the third transistor T3.

Figure 5:
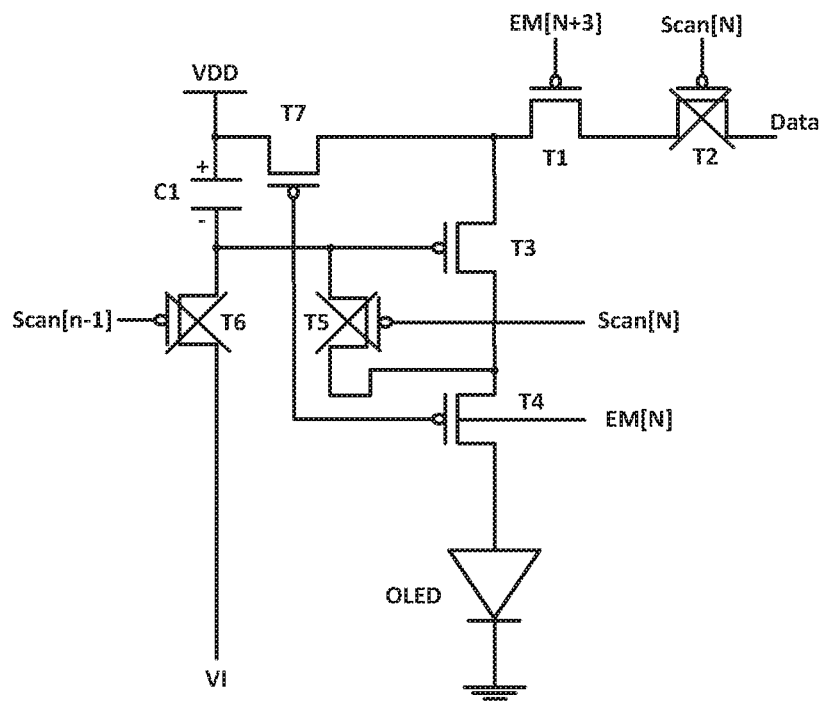
FIG. 5 is a schematic illustrating equivalent circuit structure of the pixel driving circuit in the light-emitting phase according to embodiment of the present invention.

Light-emitting phase: the pixel driving circuit operates in the Light-emitting phase, when the second enabling signal EM[N] is at a low level, i.e., 0, and the grayscale data voltage stops being written at this moment, and the second scanning signal Scan[N−1] and the first scanning signal Scan[N] are at a high level, i.e., 1. At this moment, the fourth transistor T4 and the seventh transistor T7 are in a conductive state, the fifth transistor T5 and the sixth transistor T6 are in a turn-off state, and the storage capacitor C1 is in a remaining state. Referring to FIG. 5, which is a schematic illustrating equivalent circuit of pixel driving circuit structure in light-emitting phase according to the embodiment of the present invention. As shown in FIG. 5, the fourth transistor T4 and the seventh transistor T7 are switch transistors, and the storage capacitor C1 is in a remaining state, that is, the voltage of positive electrode and negative electrode in storage capacitor C1 retain the same and last from the data written phase to the light-emitting phase. As such, the source voltage $V_s$ of the third transistor T3 (i.e., driving transistor) is $V_{dd}$, and the gate voltage $V_g$ of the third transistor T3 is equal to the voltage of negative electrode in storage capacitor C1, that is the difference between the grayscale data voltage $V_{data}$ and threshold voltage $V_{th}$ of the third transistor T3, which could be expressed in terms of algebra, $V_{data}-V_{th}$. Thus, the gate-source voltage of the driving transistor could be expressed as:

$$V_{gs}=V_g-V_s=V_{data}-V_{th}-V_{dd}$$

Consider that the third transistor T3 is a p-type transistor, which is in a conductive state when in a negative voltage state, and is in a turn-off state when in a positive voltage state. Consequently the gate-source voltage could be expressed as:

$$V_{gs}=V_{dd}-V_{data}+V_{th}$$

As a result of equation calculating saturated current in the light-emitting device:

$$I_{OLED}=K(V_{gs}-V_{th})^2$$

where K is a parameter with respect to the driving transistor T3, Vgs is the gate-source voltage of the driving transistor T3, and Vth is threshold voltage of the driving transistor T3. As a result of the equation:

$$V_{gs}=V_{dd}-V_{data}+V_{th}$$

Thus, it implies:

$$I_{OLED}=K(V_{dd}-V_{data})^2$$

From above-mentioned equation, it could be observed that, in the light-emitting phase, the saturated current of light-emitting device is no longer affected by the threshold voltage of the third transistor T3. At this moment, the saturated current magnitude is only relevant to the power voltage $V_{dd}$ and the grayscale data voltage $V_{data}$, and both the power voltage $V_{dd}$ and the grayscale data voltage $V_{data}$ are fixed values, that is, current passing through the light-emitting device is guaranteed to the constant, such that non-uniform pixel color could be avoided.

In implementation of the embodiment according to the present invention, when above-mentioned pixel driving circuit is at the moment that the light-emitting device is in the light-emitting state, the voltage of the negative electrode of the storage capacitor storing in the charging phase is the difference between the grayscale data voltage and the threshold voltage of the third transistor T3, and also equal to the gate voltage of the third transistor T3, i.e., the driving transistor. When solving saturated current of the driving transistor, saturated current magnitude is only relevant to the power voltage $V_{dd}$ and the grayscale data voltage $V_{data}$. Besides, both the power voltage $V_{dd}$ and the grayscale data voltage $V_{data}$ are fixed values, that is, current passing through the light-emitting device is guaranteed to the constant, such that current passing through the light-emitting device is no longer affected by the threshold voltage $V_{th}$ of the driving transistor and non-uniform pixel color could be avoided, accordingly, image uniformity of display with light-emitting device (e.g., OLED) raises, and so does display quality.

Figure 6:
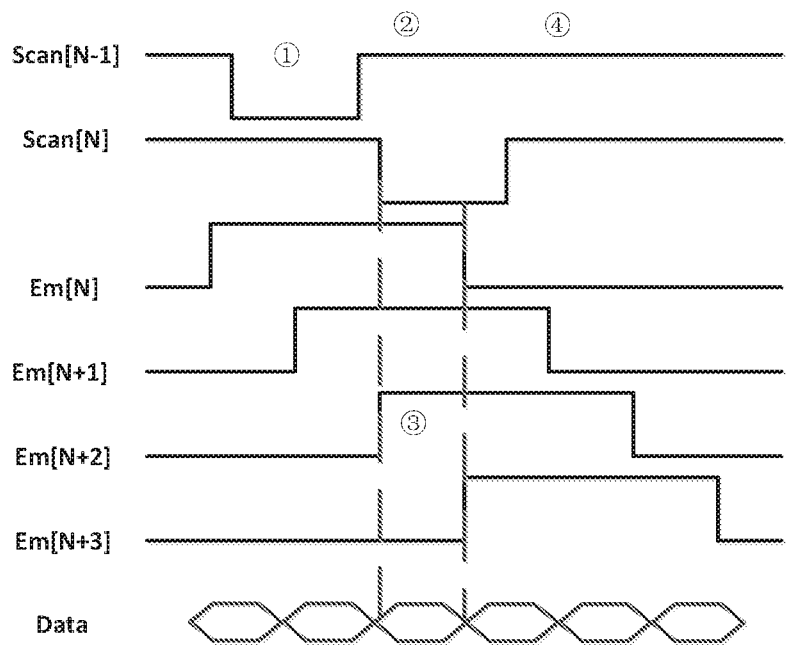
FIG. 6 is a schematic illustrating driving time sequence of $N^{th}$ row (N is odd) of pixel driving circuit according to embodiment of the present invention.

Subsequently, how to generate the second scanning signal Scan[N−1], the first scanning signal Scan[N], the second enabling signal EM[N], and the first enabling signal EM[N+3] as described above, will be introduced. Referring to FIG. 6, which is a schematic illustrating driving time sequence of $N^{th}$ row (N is odd) of pixel driving circuit according to the embodiment of the present invention. As shown in FIG. 6, in the reset phase, the second enabling signal EM[N] and the first scanning signal Scan[N] are of high level, which are ineffective levels, while the second scanning signal Scan[N−1] is of low level, which is a effective level; in the data written phase, the second enabling signal EM[N] and the second scanning signal Scan[N−1] are of high level, which are ineffective levels, while the first scanning signal Scan[N] is of low level, which is a effective level; in the light-emitting phase, the second enabling signal EM[N] is of low level, which is a effective level, while the first scanning signal Scan[N], the second scanning signal Scan[N−1], and the first enabling signal EM[N+3] are of high level, which are ineffective levels. For the operating process of driving time sequence, please refer to the driving circuit operating process described in FIG. 2, which will not be repeated here again.

Figure 7:
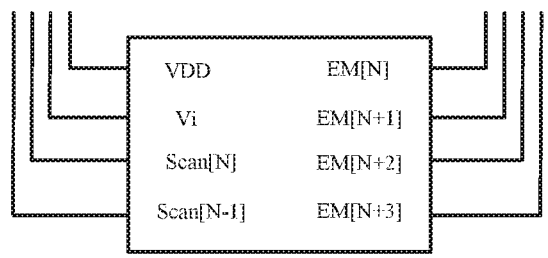
FIG. 7 is a schematic illustrating Gate Driver on Array (GOA) circuit driving scanning line according to embodiment of the present invention.
Figure 8:
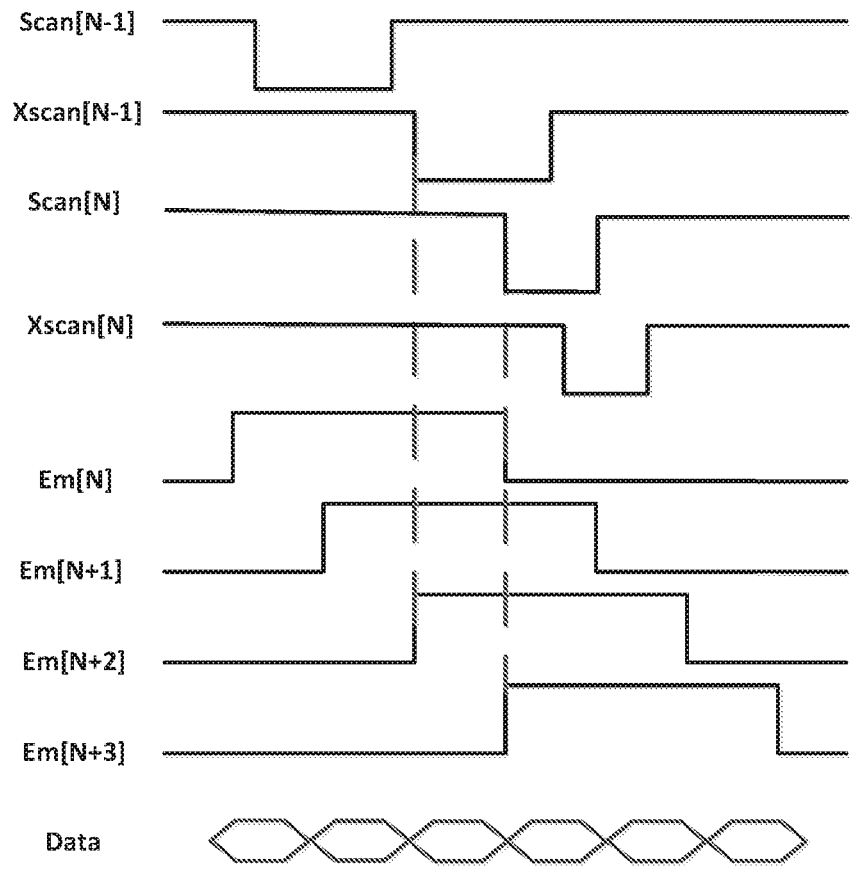
FIG. 8 is a schematic illustrating driving time sequence of N+1th row (N is odd) of pixel driving circuit according to embodiment of the present invention.
Figure 9:
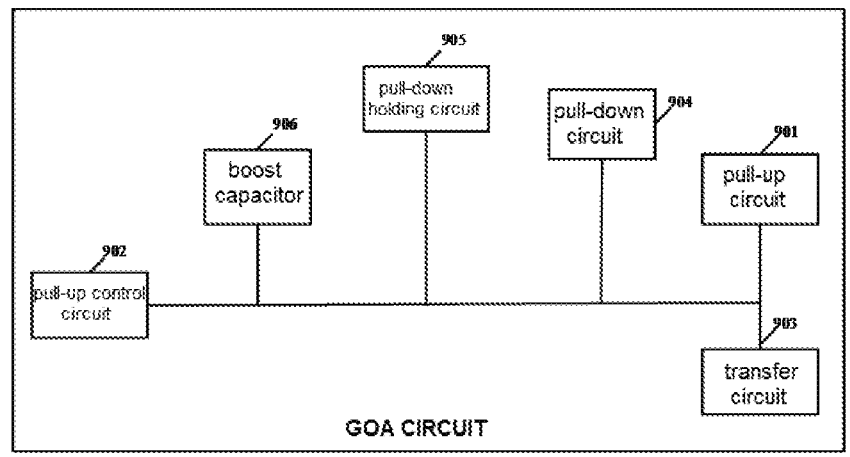
FIG. 9 is a schematic illustrating Gate Driver on Array (GOA) driving circuit structure according to embodiment of the present invention.

In several possible implements, the second enabling signal EM[N], the first enabling signal EM[N+3], the first scanning signal Scan[N] and the second scanning signal Scan[N−1] could be provided by a GOA circuit. The GOA circuit includes a plurality of cascaded GOA units, and each one stage GOA unit correspondingly drives one stage scanning line. Each GOA unit includes one pull-up circuit, one pull-up control circuit, one transfer circuit, one pull-down circuit, one pull-down holding circuit and one boost capacitor for boosting voltage. Referring to FIG. 7, which is a schematic illustrating GOA circuit driving scanning line according to the embodiment of the present invention. In on possible implement, the second enabling signal EM[N], the first enabling signal EM[N+3], the first scanning signal Scan[N] and the second scanning signal Scan[N−1], which are provided by the GOA circuit, could be classified into three categories: the first category are used for controlling odd rows of pixel circuit, which are the first scanning signal Scan[N] and the second scanning signal Scan[N−1], specifically, please refer to FIG. 6; the second category are used for controlling even rows of pixel circuit, which are the third scanning signal Xscan[N] and the fourth scanning signal Xscan [N−1], specifically, please refer to FIG. 8, which is a schematic illustrating driving time sequence of $N+1^{th}$ row (N is odd) of pixel driving circuit according to the embodiment of the present invention. As shown in FIG. 8, in the reset phase, the third enabling signal EM[N+1] and the third scanning signal Xscan[N] are of high level, which are ineffective levels, while the fourth scanning signal Xscan[N−1] is of low level, which is a effective level; in the data written phase, the second enabling signal EM[N] and the fourth scanning signal Xscan[N−1] are of high level, which are ineffective levels, while the third scanning signal Xscan[N] is of low level, which is a effective level; in the light-emitting phase, the third enabling signal EM[N+1] is of low level, which is a effective level, while the third scanning signal Xscan[N], the fourth scanning signal Xscan[N−1] and the fourth enabling signal EM[N+4] are of high level, which are ineffective levels. For the operating process of driving time sequence, please refer to the driving circuit operating process described in FIG. 2A, which will not be repeated here again; the third category are the second control enabling signal EM[N] and the first enabling signal EM[N+3], which are row sequentially controlled to control light-emitting of the light-emitting device in the pixel driving circuit. Referring to FIG. 9, which is a schematic illustrating GOA circuit structure according to the embodiment of the present invention. As shown in FIG. 9, main structure of GOA might include, but not limited to, one pull-up circuit 901, one pull-up control circuit 902, one transfer circuit 903, one pull-down circuit 904, one pull-down holding circuit 905 and one boost capacitor 906 for boosting voltage. Take the first scanning signal Scan[N] provided by above-mentioned GOA circuit as an example. The pull-up control circuit 902 receives a N−1 stage stage-transfer signal ST(N−1) of N−1$^{th}$ stage GOA unit, and outputs an pull-up control signal Q(N) on the basis of the N−1 stage stage-transfer signal ST(N−1). The pull-up circuit 901 electrically connects with the pull-up control circuit 902, and receives a direct high-voltage signal VDD and the pull-up control signal Q(N). Besides the pull-up circuit 901 outputs a first scanning signal Scan [N] on the basis of the direct high-voltage signal VDD and the pull-up control signal Q(N). The transfer circuit 903 electrically connects with the pull-up control circuit 902 and the pull-up circuit 901, and receives an clock signal CK(N) and the pull-up control signal Q(N). Besides, the transfer circuit 903 outputs an N stage stage-transfer signal ST(N) on the basis of the clock signal CK(N) and the pull-up control signal Q(N). The pull-down circuit 904 electrically connects with the pull-up control circuit 902, the pull-up circuit 901 and the transfer circuit 903. Besides, the pull-down circuit 904 receives the direct low-voltage signal Vss and the N stage stage-transfer signal ST(N). Besides, the pull-down circuit 904 pulls down the pull-up control signal Q(N) and the first scanning signal Scan [N] on the basis of the direct low-voltage signal Vss and the N stage stage-transfer signal ST(N). And so forth, the second enabling signal EM [N], the third enabling signal EM [N+1] and the first enabling signal EM [N+3], which are included in the embodiments of the present invention, could provided by above-mentioned GOA circuit. It should be clarified that above-mentioned GOA circuit is merely as an example, and any extension or modification of other GOA circuits is all allowed, as long as satisfying to provide the first scanning signal Scan [N], the second scanning signal Scan [N−1], the second enabling signal EM [N], the third enabling signal EM [N+1] and the first enabling signal EM [N+3], which are mentioned in the embodiments of the present invention.

It should be clarified that positive terminal of the storage capacitor C1 in the embodiments of the present invention is coupled with the power voltage $V_{dd}$ which is both power voltage and direct voltage, wherein magnitude and direction of the voltage do not change with time. The drain of the sixth transistor T6 is coupled with an operating voltage Vi which is direct voltage. The second enabling signal EM [N], the first enabling signal EM [N+3], the first scanning signal Scan [N], and the second scanning signal Scan [N−1] are alternating signals. In some possible implements, the light-emitting device could both be OLEDs and AMOLEDs, yet other types of light-emitting device, not concretely limited in the embodiments of the present invention.

Figure 10:
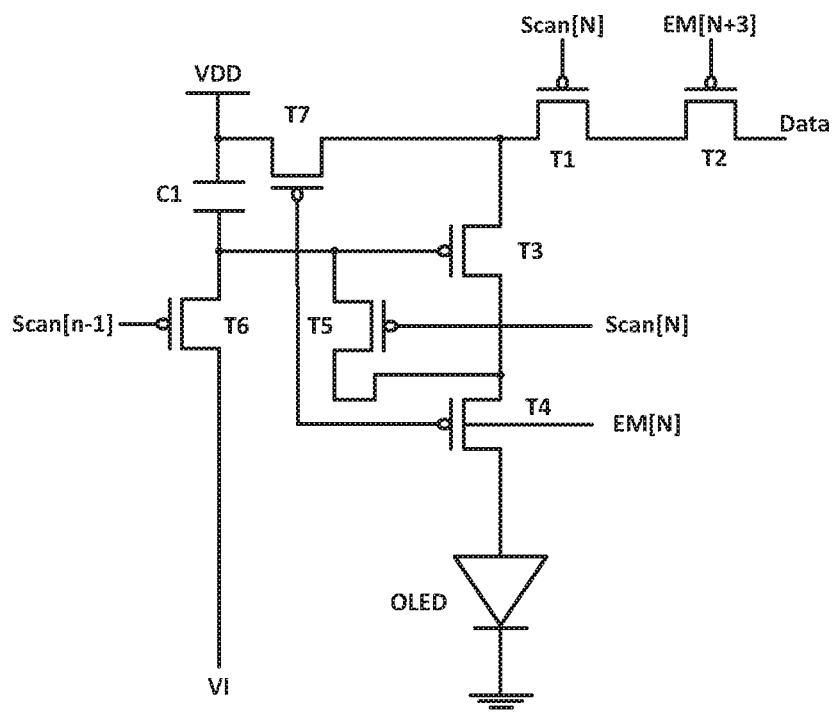
FIG. 10 is a schematic illustrating another pixel driving circuit structure according to embodiment of the present invention.

In one possible implement, gate input signals of the first transistor T1 and the second transistor T2 could be interchanged, that is, the gate input signal of the first transistor T1 is the first scanning signal Scan[N], while the gate input signal of the second transistor T2 is the first enabling signal EM[N+3], Specifically, referring to FIG. 10, which is a schematic illustrating another pixel driving circuit structure according to the embodiment of the present invention.

A display apparatus is provided by another embodiment of the present invention, and the display apparatus includes the pixel driving circuit illustrated in FIG. 2.

Figure 11:
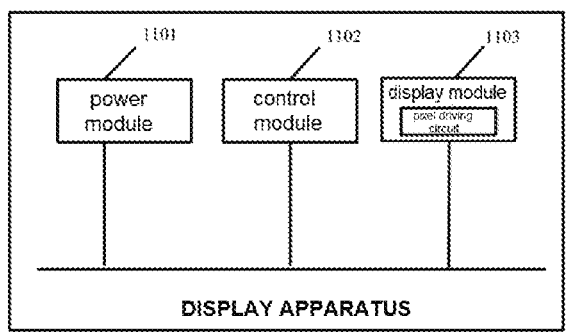
FIG. 11 is a schematic illustrating display apparatus structure according to another embodiment of the present invention.

Referring to FIG. 11, which is a schematic illustrating display apparatus structure according to another embodiment of the present invention. The display apparatus as shown in FIG. 11 might include: a power module 1101, a control module 1102, and a display module 1103 (the pixel driving circuit is included). Above-mentioned power module 1101 is mainly used for converting input voltage-current into required voltage-current of display apparatus; above-mentioned control module 1102 is mainly used for making the display module show different words, figures, etc., by means of controlling grayscale of corresponding section. This substantial operation is that the control module 1102 makes different words and figures appear on the display module 1103 by means of controlling grayscale of light-emitting device of pixel driving circuit in the display module 1103. Above-mentioned display module 1103 consists of the light-emitting device lattice. In some possible implements, the light-emitting device might both be LED and OLED, yet other light-emitting devices, which are not concretely limited in embodiments of the present invention. The display module is mainly used for lighting and displaying. It should be clarified that above-mentioned display apparatus is merely as an example, in some possible implements, a display apparatus might include two portions of control module and display module, wherein the power module is integrated in the control module, which will not be repeated here again.

Optionally, the display apparatus includes, but not limited to, a display.

Another embodiment of the present invention provides a terminal, and the terminal includes above-mentioned display apparatus.

Figure 12:
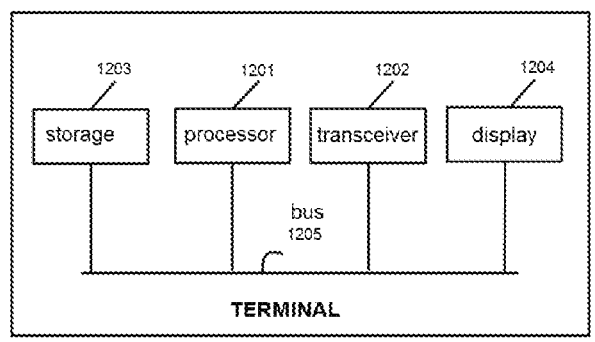
FIG. 12 is a schematic illustrating terminal structure according to another embodiment of the present invention.

Referring to FIG. 12, which is a schematic illustrating terminal structure according to another embodiment of the present invention. The terminal as shown in FIG. 12 might include: one or a plurality of processors 1201, a transceiver 1202, storage 1203, a display 1204 and a bus 1205. The processors 1201, the transceiver 1202, the storage 1203, the display 1204 are linked via the bus 1205 or other ways, and the way of bus is used as an example to be illustrated in embodiments of the present invention.

In embodiments of the present invention, so-called processor 1201 might be a Central Processing Unit (CPU) and the processor might be yet other general purpose processor, a Digital Signal Processor (DSP), Application Specific Integrated Circuit (ASIC), Field-Programmable Gate Array (FPGA), or other Programmable Logic Devices, a transistor logic device, discrete hardware components, etc. A general-purpose processor may be a microprocessor or any normal processor.

The storage 1203 is used for storing commands and/or data. The storage 1203 might include Read-Only Memory (ROM) and Random Access Memory (RAM), and provides commands and data toward the processor 1201. A portion of the storage might further include a non-volatile memory. For example, the storage 1203 could further store device type information.

The processor 1201 could invoke codes stored in the storage 1203 via the bus 1205, so as to execute concrete operation.

The display 1204 could show the words and figures which are processed via the processor 1201.

Although several exemplary embodiments of the present invention have been shown and described for object, solutions and effects of the present invention, it would be appreciated by those skilled in the art that various changes or modifications may be made in these embodiments without departing from the principles and spirit of the present invention, the scope of which is defined in the claims and their equivalents.

What is claimed is:

1. A pixel driving circuit, comprising: a light-emitting device, an enabling unit, a first transistor, and a second transistor;
    wherein a first terminal of the light-emitting device connects with a first terminal of the enabling unit, and a second terminal of the light-emitting device is grounded, a power voltage ($V_{dd}$) accesses a second terminal of the enabling unit, a power voltage ($V_{dd}$) is applied to a second terminal of the enabling unit, a third terminal of the enabling unit connects with a source of the first transistor, a fourth terminal of the enabling unit receives an operating voltage ($V_i$), and a drain of the first transistor connects with a source of the second transistor, a gate of the first transistor receives a first enabling signal (EM[N+3]), and a gate of the second transistor receives a first scanning signal (Scan[N]), a drain of the second transistor is coupled with a grayscale data voltage ($V_{data}$) signal, wherein the first enabling signal (EM[N+3]) and the first scanning signal (Scan[N]) are adapted for controlling the source of the first transistor to receive the grayscale data voltage ($V_{data}$); and
    wherein saturated current passing through the light-emitting device is relevant to the voltage of the power and the grayscale data voltage, when the light-emitting device emits light,
    wherein the enabling unit includes a third transistor, a fourth transistor, a fifth transistor, a sixth transistor, a seventh transistor and a storage capacitor;
    wherein a first terminal of the enabling unit is a drain of the fourth transistor, a second terminal of the enabling unit is juncture between a positive terminal of the storage capacitor and a source of the seventh transistor, a third terminal of the enabling unit is juncture between a source of the third transistor and a drain of the seventh transistor, and a fourth terminal of the enabling unit is a drain of the sixth transistor;
    wherein a positive terminal of the storage capacitor connects with juncture between the power voltage (Vdd) and the drain of the seventh transistor, a negative terminal of the storage capacitor connects with juncture between a source of the sixth transistor and a gate terminal of the third transistor;
    wherein the gate of the third transistor connects with a drain of the fifth transistor, the source of the third transistor T3 connects with juncture between the drain of the seventh transistor T7 and the drain of the first transistor T1, and the drain of the third transistor connects with juncture between the source of the fifth transistor and the source of the fourth transistor;
    wherein a gate of the fourth transistor connects with a gate of the seventh transistor, an input signal of the gate in the fourth transistor and an input signal of the gate in the seventh transistor are second enabling signals (EN[N]), and the drain of the fourth transistor connects with a positive electrode of the light-emitting device;
    wherein an input signal of a gate in the fifth transistor is the first scanning signal (Scan[N]); and
    wherein an input signal of a gate in the sixth transistor is the second scanning signal (Scan[N−1]), and the drain of the sixth transistor is coupled with the operating voltage (Vi).

2. The circuit according to claim 1, wherein if the first enabling signal (EM[N+3]) is of high level and the first scanning signal (Scan[N]) is of low level, then the first transistor is in a turn-off state and the second transistor is in a conductive state, and input signals of the drain of the second transistor are grayscale data voltage, in addition, voltage of juncture between the drain of the seventh transistor and the source of the third transistor is not equal to the grayscale data voltage.

3. The circuit according to claim 1, wherein the sixth transistor is in a conductive state, the storage capacitor discharges through the third transistor and the sixth transistor, and the source and the drain of the third transistor are floated, when the second scanning signal (Scan[N−1]) is at a low level.

4. The circuit according to claim 1, wherein the second enabling signal (EM[N]) is at a high level, and the first scanning signal (Scan[N]) is at a low level and the second scanning signal (Scan[N−1]) is at a high level, in the meantime, the fifth transistor is in a conductive state, the sixth transistor is in a turn-off state, the first transistor and the second transistor are in a conductive state, and the storage capacitor is in a charging state; voltage of negative electrode in the storage capacitor is equal to the gate voltage of the third transistor, and specifically is equal to the difference between the grayscale data voltage and threshold voltage of the third transistor.

5. The circuit according to claim 4, wherein the second enabling signal (EM[N]) is at a low level, the second scanning signal (Scan[N−1]) and the first scanning signal (Scan[N]) are at a high level, in the meantime, the fourth transistor and the seventh transistor are in a conductive state, the fifth transistor and the sixth transistor are in a turn-off state and the storage capacitor is in a remaining state; a source voltage of third transistor is $V_{dd}$ and a gate voltage of it is equal to the voltage of negative electrode in storage capacitor, that is, the difference between the grayscale data voltage $V_{data}$ and threshold voltage $V_{th}$ of the third transistor, thus, a gate-source voltage difference of the third transistor could be expressed as "$V_{dd}-V_{data}+V_{th}$" and the gate-source voltage difference is used to drive light-emitting device to emit light.

6. The circuit according to claim 1, wherein the first scanning signal (Scan[N]) and the first enabling signal (EM[N+3]) could be provided by a GOA circuit;
    wherein the GOA circuit includes a plurality of cascaded GOA units, and each one stage GOA unit correspondingly drives one stage scanning line; and wherein GOA circuit drives the scanning signal (Scan[N]) when N is odd; GOA circuit drives the scanning signal (Xscan[N]) when N is even.

7. The circuit according to claim 1, wherein the third transistor, the fourth transistor, the fifth transistor, the sixth transistor and the seventh transistor are all p-type transistors, satisfied for being conductive when applied with negative voltage and being turned off when applied with positive voltage.

8. A display apparatus including pixel driving circuit, wherein the pixel driving circuit comprises: a light-emitting device, an enabling unit, a first transistor, and a second transistor;
   wherein a first terminal of the light-emitting device connects with a first terminal of the enabling unit and a second terminal of the light-emitting device is grounded, a power voltage ($V_{dd}$) accesses a second terminal of the enabling unit, a third terminal of the enabling unit connects with a source of the first transistor, a fourth terminal of the enabling unit receives an operating voltage ($V_i$), and a drain of the first transistor connects with a source of the second transistor, a gate of the first transistor receives a first enabling signal (EM[N+3]), and a gate of the second transistor receives a first scanning signal (Scan[N]), a drain of the second transistor is coupled with a grayscale data voltage ($V_{data}$) signal, wherein the first enabling signal (EM[N+3]) and the first scanning signal (Scan[N]) are adapted for controlling the source of the first transistor to receive the grayscale data voltage ($V_{data}$); and
   wherein saturated current passing through the light-emitting device is relevant to the voltage of the power and the grayscale data voltage, when the light-emitting device emits light;
   wherein the enabling unit includes a third transistor, a fourth transistor, a fifth transistor, a sixth transistor, a seventh transistor and a storage capacitor;
   wherein a first terminal of the enabling unit is a drain of the fourth transistor, a second terminal of the enabling unit is juncture between a positive terminal of the storage capacitor and a source of the seventh transistor, a third terminal of the enabling unit is juncture between a source of the third transistor and a drain of the seventh transistor, and a fourth terminal of the enabling unit is a drain of the sixth transistor;
   wherein a positive terminal of the storage capacitor connects with juncture between the power voltage ($V_{dd}$) and the drain of the seventh transistor, a negative terminal of the storage capacitor connects with juncture between a source of the sixth transistor and a gate terminal of the third transistor;
   wherein the gate of the third transistor connects with a drain of the fifth transistor, the source of the third transistor T3 connects with juncture between the drain of the seventh transistor T7 and the drain in the first transistor T1, and the drain of the third transistor connects with juncture between the source of the fifth transistor and the source of the fourth transistor;
   wherein a gate of the fourth transistor connects with a gate of the seventh transistor, an input signal of the gate in the fourth transistor and an input signal of the gate in the seventh transistor are second enabling signals (EN[N]), and the drain of the fourth transistor connects with a positive electrode of the light-emitting device;
   wherein an input signal of a gate in the fifth transistor is the first scanning signal (Scan[N]); and
   wherein an input signal of a gate in the sixth transistor is the second scanning signal (Scan[N−1]), and the drain of the sixth transistor is coupled with the operating voltage ($V_i$).

9. The display apparatus according to claim 8, wherein if the first enabling signal (EM[N+3]) is of high level and the first scanning signal (Scan[N]) is of low level, then the first transistor is in a turn-off state and the second transistor is in a conductive state, and input signals of the drain of the second transistor are grayscale data voltage, in addition, voltage of juncture between the drain of the seventh transistor and the source of the third transistor is not equal to the grayscale data voltage.

10. The display apparatus according to claim 8, wherein the sixth transistor is in a conductive state, the storage capacitor discharges through the third transistor and the sixth transistor, and the source and the drain of the third transistor are floated, when the second scanning signal (Scan[N−1]) is at a low level.

11. The display apparatus according to claim 8, wherein the second enabling signal (EM[N]) is at a high level, and the first scanning signal (Scan[N]) is at a low level and the second scanning signal (Scan[N−1]) is at a high level, in the meantime, the fifth transistor is in a conductive state, the sixth transistor is in a turn-off state, the first transistor and the second transistor are in a conductive state, and the storage capacitor is in a charging state; voltage of negative electrode in the storage capacitor is equal to the gate voltage of the third transistor, and specifically is equal to the difference between the grayscale data voltage and threshold voltage of the third transistor.

12. The display apparatus according to claim 11, wherein the second enabling signal (EM[N]) is at a low level, the second scanning signal (Scan[N−1]) and the first scanning signal (Scan[N]) are at a high level, in the meantime, the fourth transistor and the seventh transistor are in a conductive state, the fifth transistor and the sixth transistor are in a turn-off state and the storage capacitor is in a remaining state; a source voltage of third transistor is $V_{dd}$ and a gate voltage of it is equal to the voltage of negative electrode in storage capacitor, that is, the difference between the grayscale data voltage $V_{data}$ and threshold voltage $V_{th}$ of the third transistor, thus, a gate-source voltage difference of the third transistor could be expressed as "$V_{dd}-V_{data}+V_{th}$" and the gate-source voltage difference is used to drive light-emitting device to emit light.

13. The display apparatus according to claim 8, wherein the first scanning signal (Scan[N]) and the first enabling signal (EM[N+3]) could be provided by a GOA circuit;
   wherein the GOA circuit includes a plurality of cascaded GOA units, and each one stage GOA unit correspondingly drives one stage scanning line; and
   wherein GOA circuit drives the scanning signal (Scan[N]) when N is odd; GOA circuit drives the scanning signal (Xscan[N]) when N is even.

14. The display apparatus according to claim 8, wherein the third transistor, the fourth transistor, the fifth transistor, the sixth transistor and the seventh transistor are all p-type transistors, satisfied for being conductive when applied with negative voltage and being turned off when applied with positive voltage.

15. A terminal including the display apparatus of claim 8.

* * * * *